United States Patent
Yamanobe

[11] Patent Number: 6,140,666
[45] Date of Patent: *Oct. 31, 2000

[54] THIN FILM SEMICONDUCTOR DEVICE WITH A SEMICONDUCTOR LARGE INCLUDING CRYSTALS OF AN AVERAGE GRAIN SIZE WITH A RANGE OF 50-350-Å

[75] Inventor: Masato Yamanobe, Machida, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/238,758

[22] Filed: May 5, 1994

Related U.S. Application Data

[62] Division of application No. 07/968,536, Oct. 29, 1992, Pat. No. 5,352,614, which is a continuation of application No. 07/857,826, Mar. 26, 1992, Pat. No. 5,184,200.

[30] Foreign Application Priority Data

Mar. 27, 1991 [JP] Japan ................................ 3-85752

[51] Int. Cl.[7] .................................................. H01L 29/04
[52] U.S. Cl. ............................. 257/53; 257/64; 257/462
[58] Field of Search ........................... 257/52, 53, 57, 257/58, 60, 64, 68, 70, 462

[56] References Cited

U.S. PATENT DOCUMENTS

| | | | |
|---|---|---|---|
| 4,951,113 | 8/1990 | Huang et al. | 257/66 |
| 4,979,006 | 12/1990 | Tanaka et al. | 257/57 |
| 5,002,618 | 3/1991 | Kanai et al. | 257/64 |
| 5,184,200 | 2/1993 | Yamanobe | 257/59 |

FOREIGN PATENT DOCUMENTS

| | | | |
|---|---|---|---|
| 61-142779 | 6/1986 | Japan | 257/52 |
| 61-214476 | 9/1986 | Japan | 257/57 |
| 63-114263 | 5/1988 | Japan | 257/57 |

*Primary Examiner*—Sara Crane
*Attorney, Agent, or Firm*—Fitzpatrick, Cella, Harper & Scinto

[57] ABSTRACT

A semiconductor device comprises, at least, an insulative layer; a semiconductor layer provided in contact with the insulative layer; first and second electrodes provided in contact with the semiconductor layer; and a third electrode provided through the insulative layer. The semiconductor layer has a crystallite layer whose average grain diameter lies within a range from 50 to 350 Å and an amorphous layer.

14 Claims, 12 Drawing Sheets

FIG. 1

PRIOR ART

FIG. 2

PRIOR ART

THIN FILM SEMICONDUCTOR DEVICE WITH A SEMICONDUCTOR LARGE INCLUDING CRYSTALS OF AN AVERAGE GRAIN SIZE WITH A RANGE OF 50-350-Å

This application is a division of application Ser. No. 07/968,536 filed Oct. 29, 1992, U.S. Pat. No. 5,352,614, which is a continuation of application Ser. No. 07/857,826 filed Mar. 26, 1992; U.S. Pat. No. 5,184,200.

BACKGROUND OF THE INVENTION

1. Field of the Invention

The invention relates to a thin film semiconductor device and, more particularly, to a thin film semiconductor device which can be also suitably used as a photoelectric converting device which can be used in an image processing apparatus such as facsimile, digital copying apparatus, image reader, or the like.

2. Related Background Art

A thin film semiconductor made of a non-monocrystalline semiconductor, particularly, non-monocrystalline silicon (polysilicon, crystallite silicon, and amorphous silicon) is suitably used as a photoelectric converting device which can be preferably used as a thin film semiconductor device in a photoelectric converting device having a large area or a long length. As a photoelectric converting device using a thin film semiconductor, there are two kinds of devices such as primary photo current type (photodiode type) device and secondary photo current type device. Although the primary photo-current type is a photoelectric converting device to extract electrons and holes generated by the incident light and photoelectrically convert, there is a problem such that a photo current which can be taken out as an output is small. On the other hand, according to the secondary photo current type photoelectric converting device, since a larger photo-current (secondary photo current) can be obtained as compared with that of the primary photo current type photoelectric converting device, it can be applied to apparatuses in a wider range and an attention is paid to it.

Figure 1:
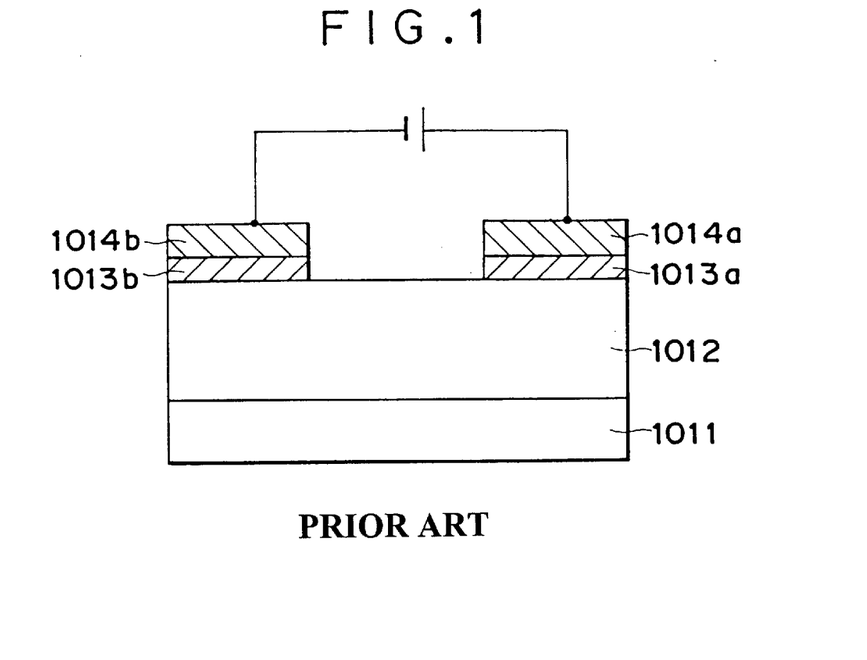
FIG. 1 is a schematic constructional diagram for explaining an example of a photoelectric converting device.

FIG. 1 is a schematic constructional diagram for explaining an example of the secondary photo current type photoelectric converting device. In FIG. 1, reference numeral 1011 denotes an insulative substrate such as glass or the like; 1012 a photoconductive semiconductor layer made of CdS-Se, amorphous silicon hydride (hereinafter, abbreviated to "a-Si:H") formed by a plasma CVD method or the like, etc.; 1013a and 1013b impurity layers for ohmic contact; and 1014a and 1014b electrodes. In the above construction, by applying a voltage across the electrodes 1014a and 1014b, a large secondary photo current flows and is photoelectrically converted when the light enters from the side of the substrate 1011 or the side of the electrodes 1014a and 1014b.

Figure 2:
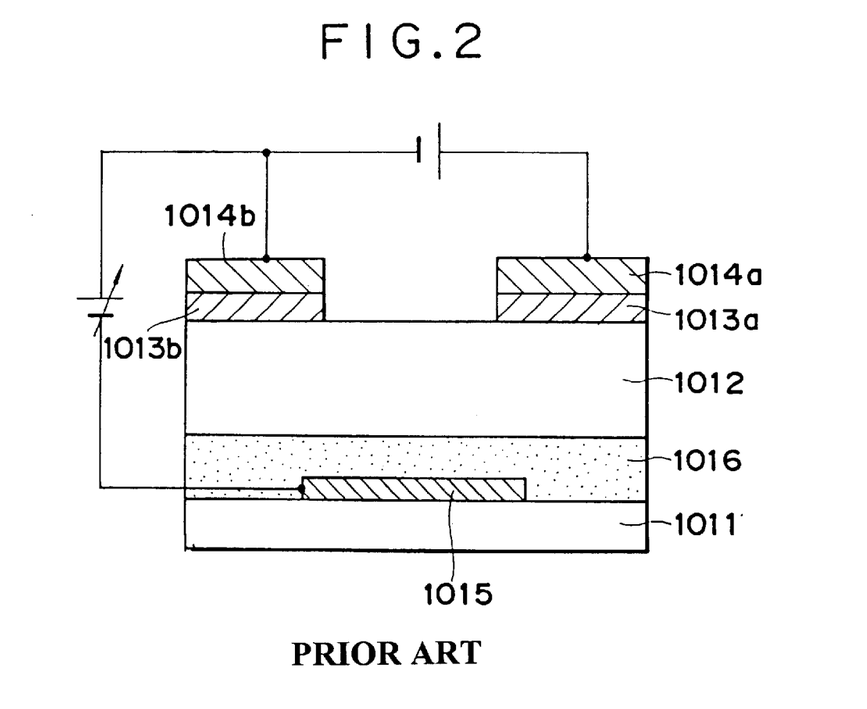
FIG. 2 is a schematic constructional diagram for explaining an example of a photoelectric converting device.

Further, a photoelectric converting device of the thin film transistor type having auxiliary electrodes to stabilize and improve the characteristics (photo current, dark current, etc.) is proposed. FIG. 2 is a schematic constructional diagram of a thin film transistor type photoelectric converting device having auxiliary electrodes. In FIG. 2, the same component elements as those shown in FIG. 1 are designated by the same reference numerals. In FIG. 2, reference numeral 1015 denotes a transparent or opaque gate electrode and 1016 indicates a gate insulative layer made of $SiN_x$ or the like and formed by a plasma CVD method or the like.

Figure 3:
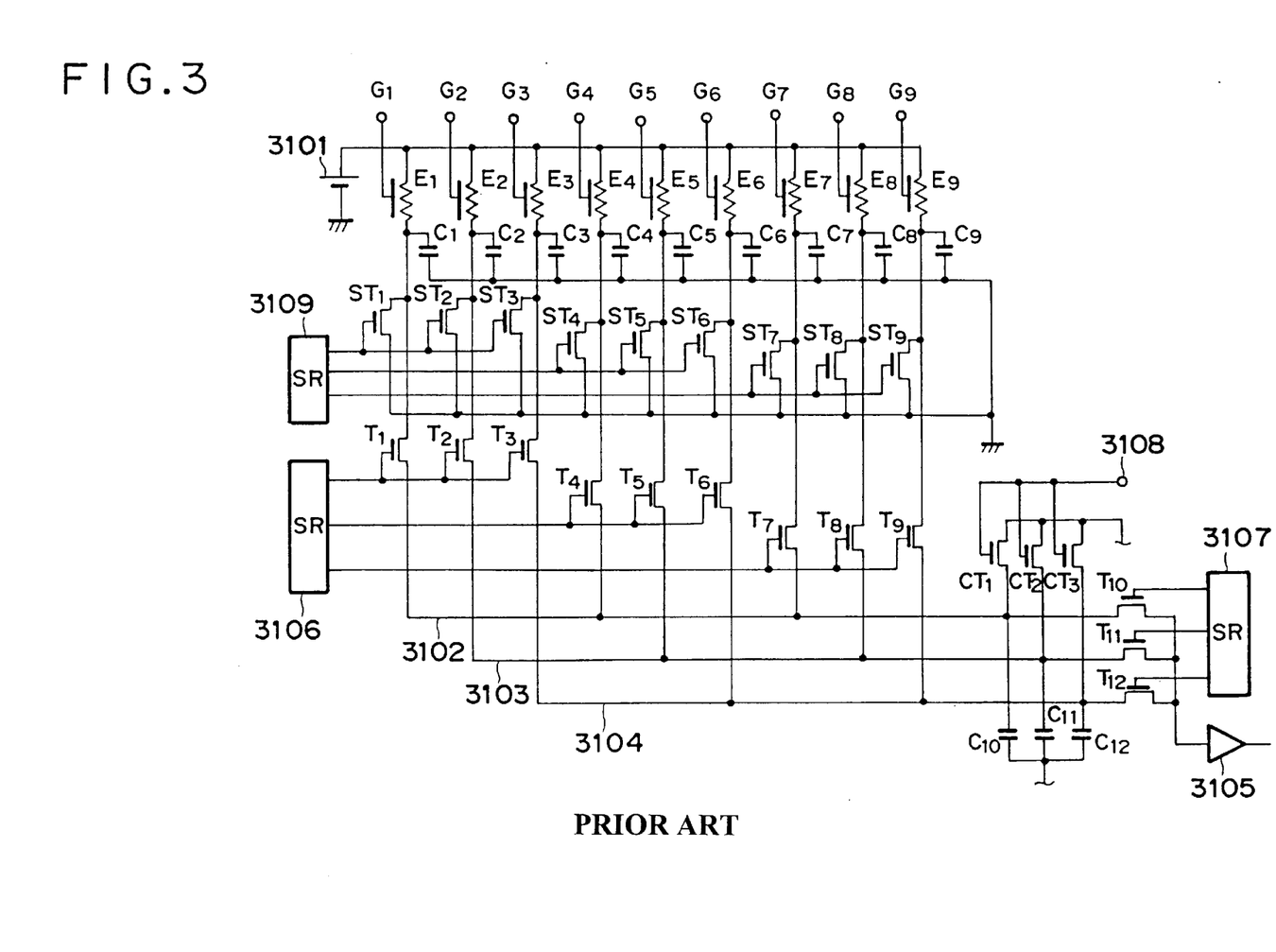
FIG. 3 is a circuit diagram of a photoelectric converting apparatus.

Further, a complete contact type photo sensor (photoelectric converting device) using the thin film transistor type photoelectric converting device of FIG. 2, a thin film transistor, and the like is proposed (JP-A-61-26365). FIG. 3 shows an example of such a circuit. FIG. 3 relates to the case of a sensor array having nine thin film transistor type photoelectric converting sections. In the diagram, one block is constructed by every three of thin film transistor type photoelectric converting sections $E_1$ to $E_9$. Thus, three blocks are formed by the converting sections $E_1$ to $E_9$. The sensor array is constructed by those three blocks. Capacitors $C_1$ to $C_9$ and switching transistors $T_1$ to $T_9$ are respectively connected to the converting sections $E_1$ to $E_9$ in. correspondence thereto. Individual electrodes of the photoelectric converting sections $E_1$ to $E_9$ are connected to corresponding proper one of common lines 3102 to 3104 through the switching transitors $T_1$ to $T_9$. In more detail, the first switching transistors $T_1$, $T_4$, and $T_7$ of each block are connected to the common line 3102. The second switching transistors $T_2$, $T_5$, and $T_8$ of each block are connected to the common line 3103. The third switching transistors $T_3$, $T_6$, and $T_9$ of each block are connected to the common line 3104. The common lines 3102 to 3104 are connected to an amplifier 3105 through switching transistors $T_{10}$ to $T_{12}$.

Gate electrodes of switching transistors $ST_1$ to $ST_9$ are commonly connected in a manner similar to the gate electrodes of the switching transistors $T_1$ to $T_9$ to parallel output terminals of a shift register 3109. Therefore, the switching transistors $ST_1$ to $ST_9$ are sequentially turned on every block by a shift timing of the shift register 3109.

In FIG. 3, the common lines 3102 to 3104 are respectively connected to the ground through capacitors $C_{10}$ to $C_{12}$ and to the ground through switching transistors $CT_1$ to $CT_3$. A capacitance of each of the capacitors $C_{10}$ to $C_{12}$ is set to be sufficiently larger than that of each of the capacitors $C_1$ to $C_9$. Gate electrodes of the switching transistors $CT_1$ to $CT_3$ are commonly connected and are also connected to a terminal 3108. That is, by applying a high level signal to the terminal 3108, the switching transistors $CT_1$ to $CT_3$ are simultaneously turned on, so that the common lines 3102 to 3104 are connected to the ground. Further, the photoelectric converting sections $E_1$ to $E_9$ have gate electrodes $G_1$ to $G_9$.

Figure 4:
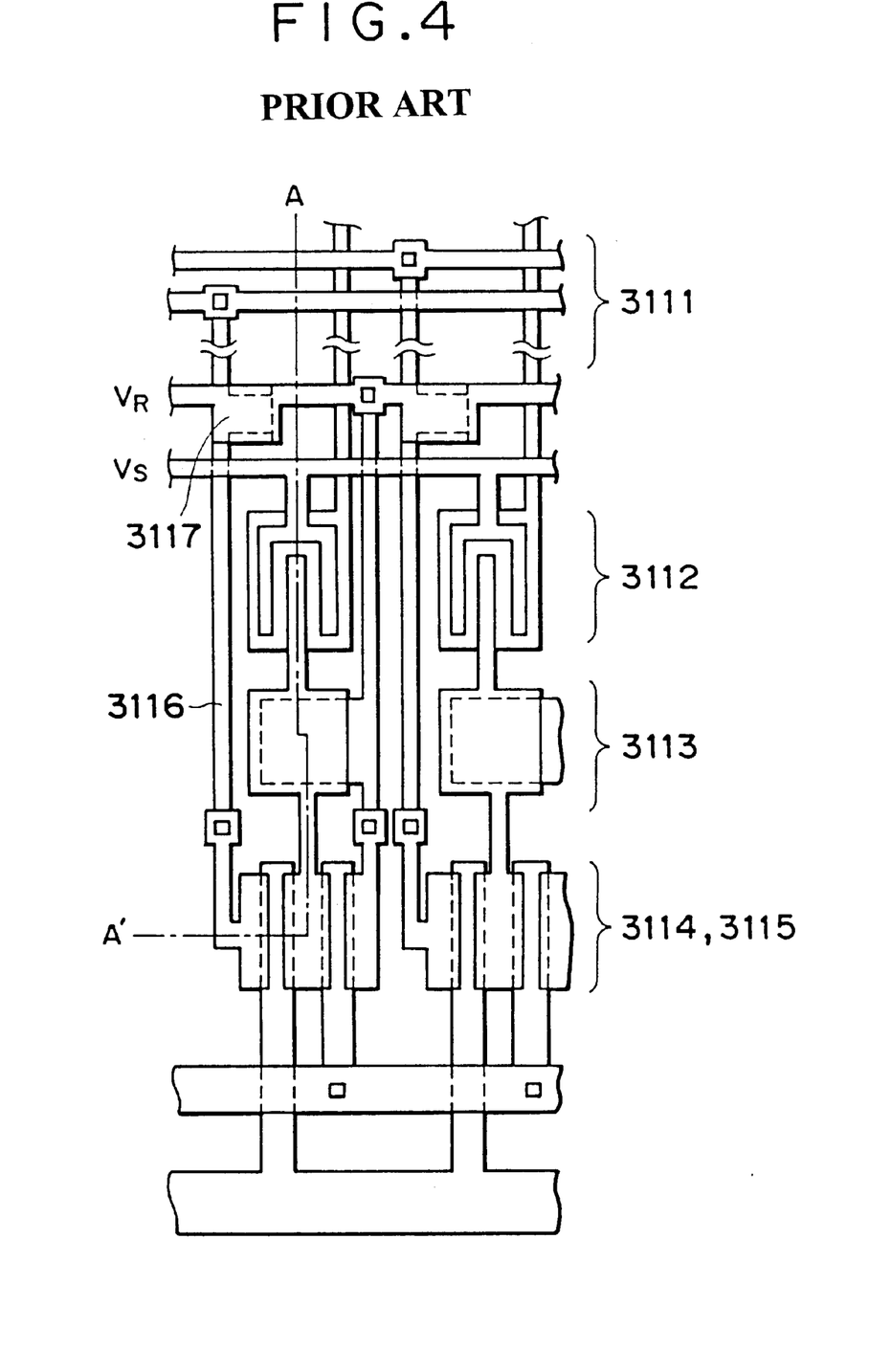
FIG. 4 is a partial plan view of a contact sensor array having the circuit of FIG. 3.

FIG. 4 is a partial plan view of a one-dimensional complete contact sensor array formed on the basis of the circuit diagram shown in FIG. 3. In the diagram, reference numeral 3111 denotes a matrix-shaped wiring portion comprising the common lines 3102 to 3104 and the like; 3112 indicates a thin film transistor type photoelectric converting section; 3113 a charge accumulating section comprising the capacitors $C_1$ to $C_9$; 3114 a transfer switch which is constructed by the switching transistor $T_1$ to $T_9$ and uses thin film transistors having the same structure as that of the photoelectric converting section; 3115 a discharge switch which comprises the switching transistors $ST_1$ to $ST_9$ and uses thin film transistors having the same structure as that of the photoelectric converting section; 3116 an extension line to connect a signal output of the transfer switch 3114 to a signal processing "IC; and" 3117 a load capacitor which comprises the capacitors $CT_1$ to $CT_3$ and is used to accumulate the signal charges which have been transferred by the transfer switch 3114 and to read out the signal charges.

Figure 5:
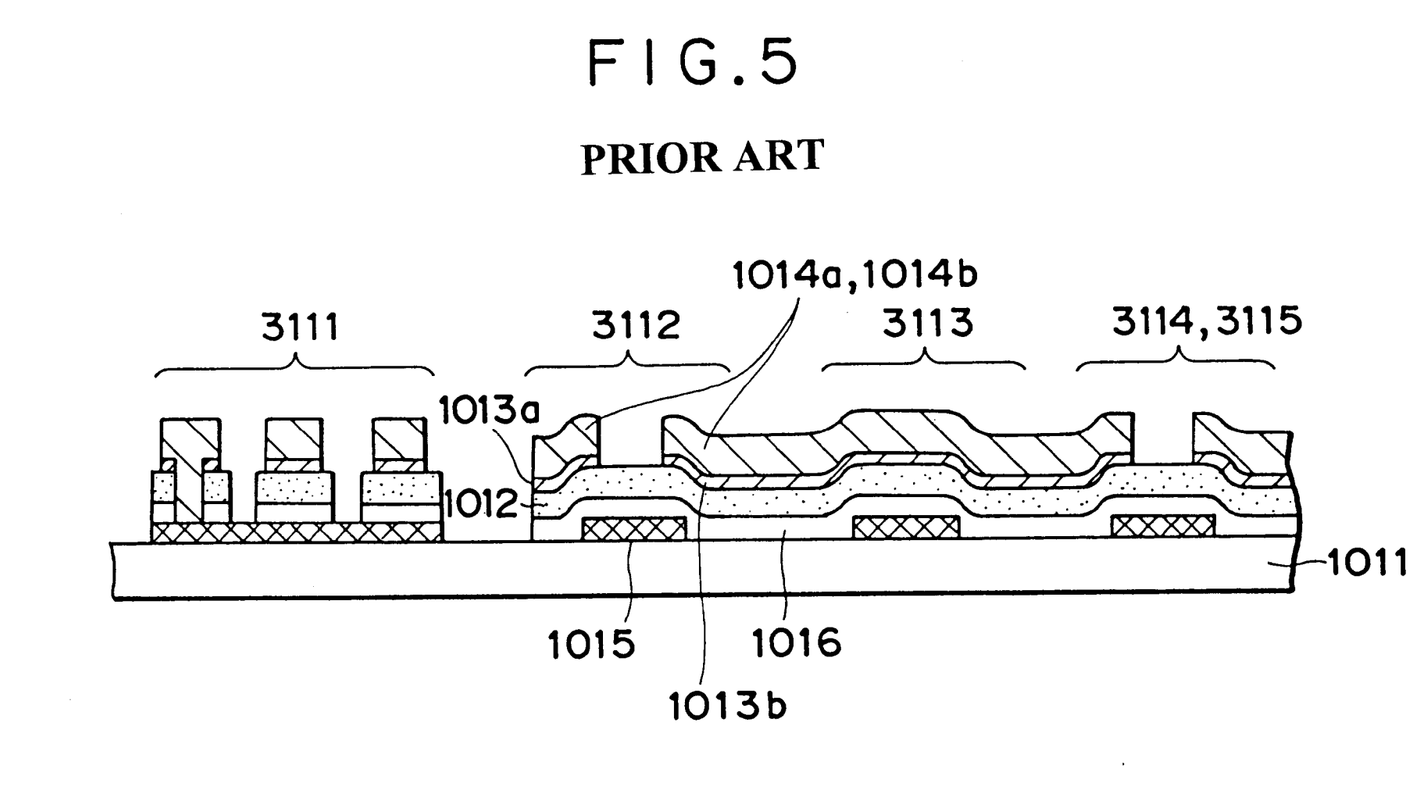
FIG. 5 is a cross-sectional view taken along the line A–A' of the contact sensor array of FIG. 4.

FIG. 5 is a cross sectional view taken along the line A–A' in FIG. 4. As will be obviously understood from FIG. 5, all of the thin film transistor type photoelectric converting section 3112, charge accumulating section 3113, transfer switch 3114, discharge switch 3115, matrix-shaped wiring section 3111, load capacitor 3117, and the like have a common construction in which a metal (gate electrode 1015 in the photoelectric converting section), an insulative layer (gate insulative layer 1016 in the photoelectric converting section), a photoconductive semiconductor layer (1012 in the photoelectric converting section), ohmic contact layers (1013a and 1013b in the photoelectric converting section), and metals (1014a and 1014b in the photoelectric converting section) are formed on the substrate 1011 in accordance with this order.

The sensor array shown in FIGS. 4 and 5 as mentioned above has the common construction in order to reduce the manufacturing costs by simultaneously manufacturing the photoelectric converting section and the drive circuit section. Particularly, when there is a high fine image reading request, the number of pixels must be increased, so that the drive circuit section which operates at a high speed is needed. However, when the thin film transistor as a thin film semiconductor device of the drive circuit section is made of a semiconductor material of a-Si:H, a mobility of the carrier lies within a range from 0.1 to 0.5 $cm^2 \cdot C^{-1} \cdot S^{-1}$ and is not enough large. Consequently, there is a limitation in the charge transfer ability. To improve the charge transfer ability, in general, a size of thin film transistor as one of the thin film semiconductor devices is enlarged, the number of drive circuit sections is set to two, or the like. However, a size of photoelectric converting apparatus is consequently enlarged and the manufacturing costs are also increased. Therefore, it is demanded to realize a photoelectric converting apparatus in which the size is not enlarged and the costs are low and which is suitable for miniaturization and has a drive circuit section having an enough high transfer ability.

SUMMARY OF THE INVENTION

The invention is made in consideration of the above problems and it is an object of the invention to provide a photoelectric converting apparatus having a drive circuit section, in which a semiconductor layer comprising a crystallite layer and an amorphous layer is used as a semiconductor layer or a photoconductive semiconductor layer, so that the semiconductor layer not only has a good performance as a semiconductor device but also maintains a good performance as a photoelectric converting section, a thin film transistor and the like of the drive circuit section can be formed by a construction which is common to the photoelectric converting section, the costs are low, the size is not enlarged, and an enough high transfer ability is provided.

The above object of the present invention can be accomplished by a thin film semiconductor apparatus comprising at least: an insulative layer; a semiconductor layer provided in contact with the insulative layer; first and second electrodes provided in contact with the semiconductor layer; and a third electrode provided via the insulative layer, wherein the semiconductor layer is formed by a crystallite layer whose average grain diameter lies within a range from 50 to 350 Å and an amorphous layer.

With the above semiconductor structure, a mobility of carriers is high and an enough high charge transfer ability can be obtained.

As mentioned above, the average grain diameter of the crystallite layer in the invention lies within a range from 50 to 350 Å in consideration of the balance between the carrier mobility and the characteristics of the apparatus, an easiness in manufacturing, and the like. A thickness of crystallite layer is preferably set to a value within a range about from 500 to 2000 Å in consideration of an effective transfer of charges.

According to the invention, the crystallite layer of the semiconductor layer can be arranged on the insulative layer side. A material containing at least silicon and hydrogen can be used as a semiconductor layer. At least the crystallite layer of the semiconductor layer can be formed by alternately performing many times the step of depositing a non-monocrystalline layer and the step of irradiating a hydrogen plasma to the deposited non-monocrystalline layer. A second insulative layer is provided in contact with the first and second electrodes provided in contact with the side of the semiconductor layer which faces the insulative layer. A fourth electrode can be provided in contact with the second insulative layer. In this case, the crystallite layer of the semiconductor layer can be also arranged on the insulative layer side, that is, the above-described second insulative layer side.

The invention can be also obviously applied to a photoelectric converting apparatus (device) using the semiconductor layer as a photoconductive semiconductor layer.

DETAILED DESCRIPTION OF THE PREFERRED EMBODIMENTS

Embodiments of the present invention will be described hereinbelow with reference to the drawings.

Embodiment 1

Figure 6:
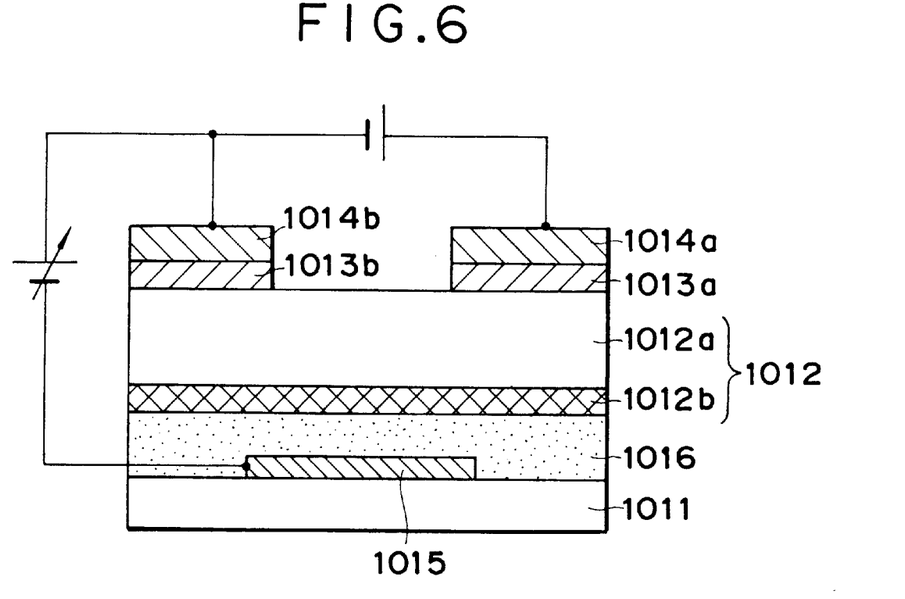
FIGS. 6, 10, and 12 are schematic constructional diagrams for explaining examples of photoelectric converting devices according to the invention, respectively.

FIG. 6 is a schematic constructional diagram of a photoelectric converting device of the invention. In the diagram, reference numeral 1011 denotes the substrate; 1016 the insulative layer; 1015 the third electrode (gate electrode); 1014a the first electrode (drain electrode); 1014b the second electrode (source electrode); 1013a and 1013b ohmic contact layers; and 1012 the photoconductive semiconductor layer. The photoconductive semiconductor layer 1012 has a double layer structure comprising: the a-Si:H layer 1012a on the side of the drain electrode 1014a and source electrode 1014b; and the crystallite layer 1012b on the side of the insulative layer 1016.

Figure 7:
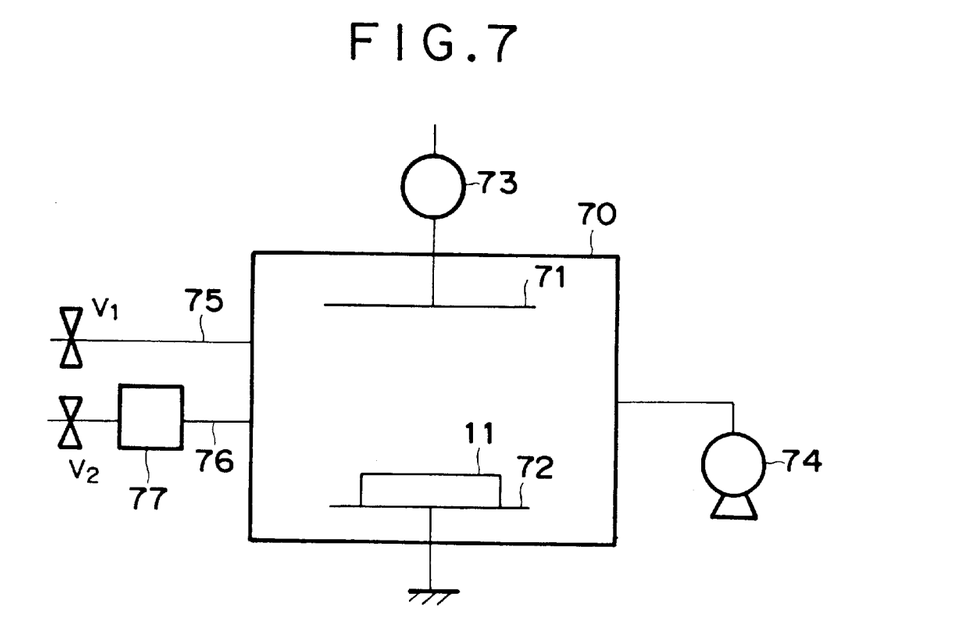
FIG. 7 is a conceptional diagram of a plasma CVD apparatus used to form the photoelectric converting device of the invention.

FIG. 7 is a constructional conceptional diagram for explaining an example of a plasma CVD apparatus used in manufacturing of the photoelectric converting device of the embodiment. In FIG. 7, reference numeral 70 denotes a reaction chamber; 11 a substrate in which functional layers such as a photoconductive semiconductor layer and the like are formed on the surface; 71 an anode electrode having a heater (not shown); 72 a cathode electrode; 73 a high frequency power source of 13.56 MHz; 74 an exhaust pump; 75 an SiH$_4$ gas introducing tube; 76 an H$_2$ gas (containing the Ar gas) introducing tube; 77 a microwave source of 2.45 GHz and a microwave applicator; and V$_1$ and V$_2$ valves to control the SiH$_4$ gas and H$_2$ gas, respectively. The valves V$_1$ and V$_2$ are connected to a computer to accurately control the opening/closing times.

The photoelectric converting device of the embodiment is manufactured in the following manner.

(1) A Cr layer having a film thickness of 0.1 μm is deposited onto the glass substrate 1011 (#7059 made by Corning Glass Works Co., Ltd.) by a sputtering method and is patterned into a desired pattern, thereby forming the gate electrode 1015.

(2) The substrate 1011 is set into the ordinary plasma CVD apparatus and a temperature of substrate is set to 350° C. After that, the SiH$_4$ gas, NH$_3$ gas, and H$_2$ gas are introduced at desired mixture ratios and the layer of SiN$_x$:H is deposited, thereby forming the insulative layer 1016 having a film thickness of 3000 Å.

(3) Subsequently, the photoconductive semiconductor layer 1012 is deposited by the following procedure by using the plasma CVD apparatus shown in FIG. 7.

① First, the substrate 1011 is set, the inside of the reaction chamber 70 is exhausted up to a predetermined pressure by the exhaust pump 74, and the substrate 1011 is simultaneously heated up to 340° C. by the heater (not shown).

Figure 8:
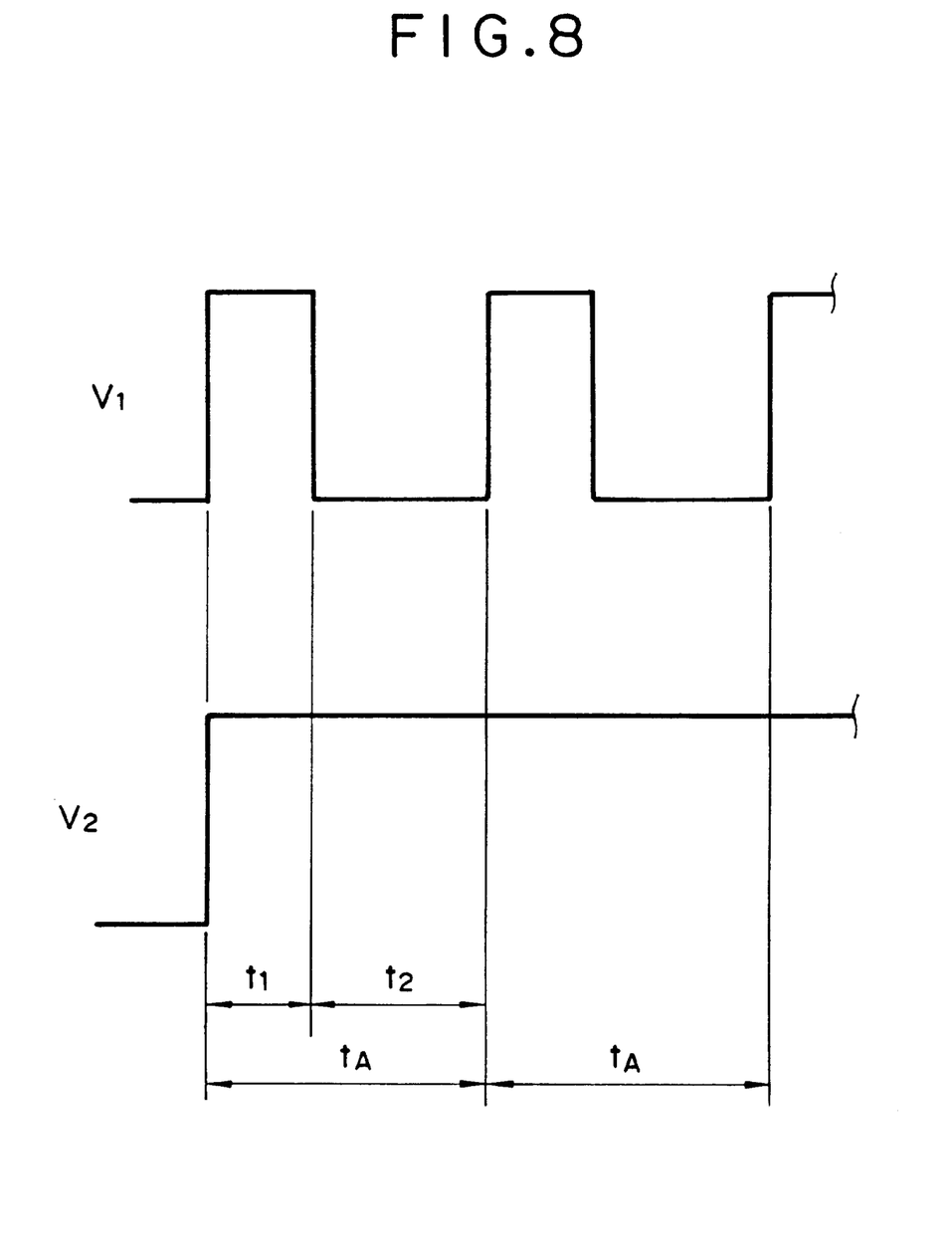
FIG. 8 is a gas introducing timing diagram in the plasma CVD apparatus in the formation of the photoelectric converting device of the invention.

② The introducing timing of the SiH$_4$ gas and H$_2$ gas are controlled as shown in FIG. 8. That is, one unit (time t$_A$) having a time t$_1$ to deposit the film and a time t$_2$ to irradiate an H$_2$ plasma is repeated. For the film depositing time t$_1$, both of the valves V$_1$ and V$_2$ are open, so that the SiH$_4$ gas, Ar gas, and H$_2$ gas are fed into the reaction chamber. The SiH$_4$ gas is set to 10 SCCM, the H$_2$ gas is set to 10 SCCM, and a pressure in the reaction chamber is adjusted to 0.1 Torr by the Ar gas. In this instance, a depositing speed is set to about 3 Å/sec. A thickness of film which is deposited for the time t$_1$ is set to about 5 Å. For the H$_2$ plasma irradiating time t$_2$, the valve V$_1$ is closed, the valve V$_2$ is opened, and the H$_2$ plasma is irradiated. A quality of film deposited for the time t$_1$ changes in dependence on the H$_2$ plasma irradiating time t$_2$. Particularly, it has been found that an amount of H contained in the film changes and, when the time t$_2$ is set to a value longer than 80 seconds, a crystallite layer is formed. In the embodiment, the crystallite layer 1012$b$ having a film thickness of 1000 Å is formed on the insulative layer 1016 side by alternately repeating the processes for the above times t$_1$ and t$_2$ a number of times. The substrate is cooled to 250° C. After that, the SiH$_4$ gas is set to 10 SCCM, the H$_2$ gas is set to 10 SCCM, the supply of the Ar gas is stopped, and the inside of the reaction chamber is set to 0.5 Torr, thereby depositing the a-Si:H layer 1012$a$ having a film thickness of 4000 Å.

(4) The substrate is set into the ordinary plasma CVD apparatus and an ohmic contact layer having a film thickness of 1500 Å is formed by using the SiH$_4$ gas, PH$_3$ gas, and H$_2$ gas.

(5) Lastly, an Al layer having a thickness of 8000 Å is formed by a sputtering method and is patterned together with the above ohmic contact layer, thereby forming the ohmic contact layers 1013$a$ and 1013$b$, drain electrode 1014$a$, and source electrode 1014$b$.

Figure 9:
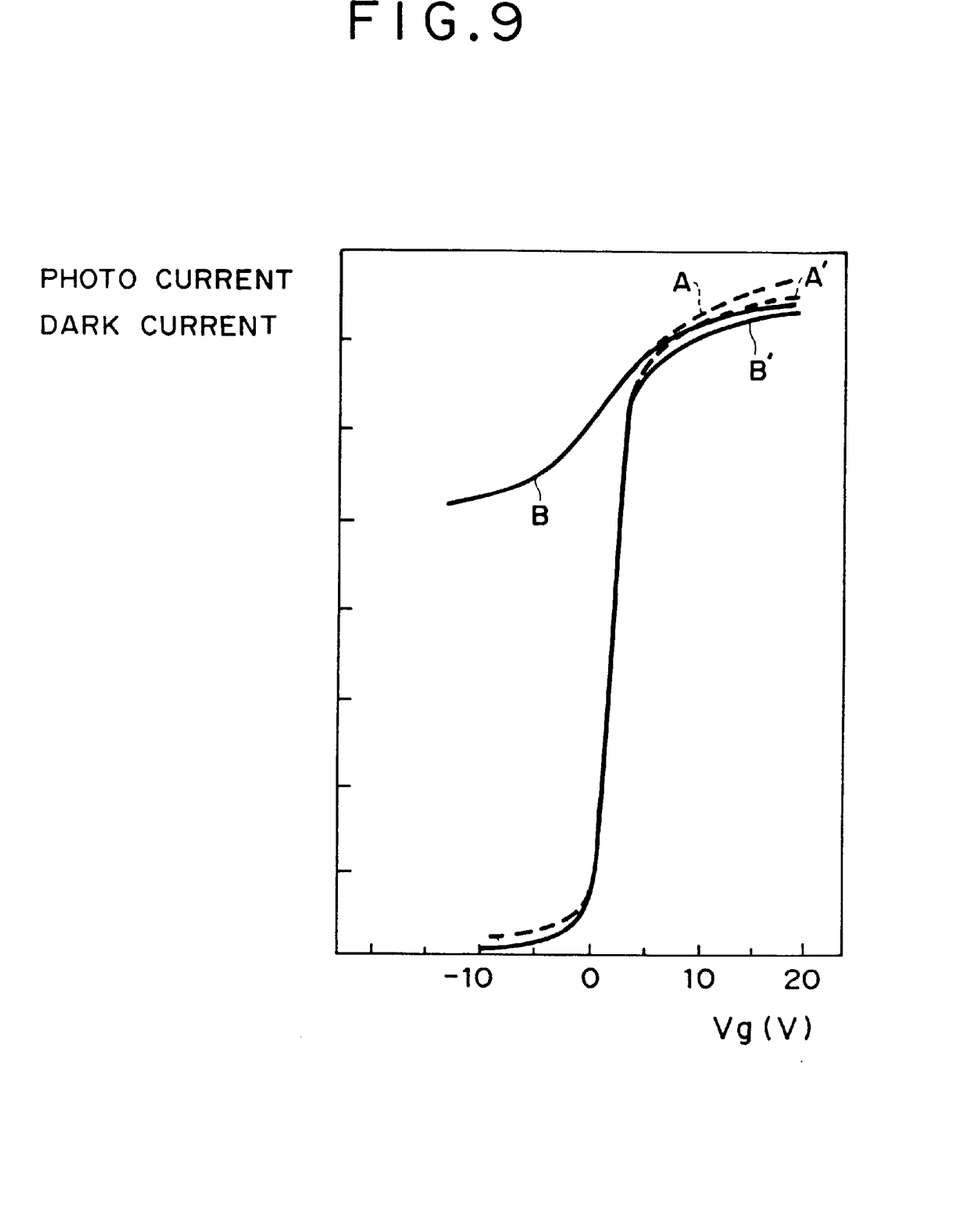
FIGS. 9, 11, and 13 are diagrams showing characteristics of the photoelectric converting devices, respectively.

To examine the fundamental characteristics of the thin film transistor formed as mentioned above, a voltage within a range from −10 to 20 V is applied to the gate electrode 1015, a voltage of 1 V is applied to the drain electrode 1014$a$, and a voltage of 0 V is applied to the source electrode 1014$b$, and currents flowing between the drain electrode 1014$a$ and the source electrode 1014$b$ in both of the light irradiating mode and the light non-irradiating mode are measured. In FIG. 9, an axis of ordinate indicates the current flowing between the drain electrode 1014$a$ and the source electrode 1014$b$ and an axis of abscissa indicates a voltage V$_G$ of the gate electrode 1015. In FIG. 9, A and A' indicate characteristics of the thin film transistor according to the embodiment of the invention in both of the light irradiating mode and the light non-irradiating mode, respectively. B and B' show characteristics of the thin film transistor in both of the light irradiating mode and the light non-irradiating mode in the case where such a thin film transistor is formed by a method similar to the above method except that the step (3) of forming the crystallite layer 1012$b$ among the steps (1) to (5) of forming the thin film transistor according to the embodiment of the invention and that the a-Si:H layer having a film thickness of 6000 Å is formed in the step of forming the a-Si:H layer 1012$a$. As shown in FIG. 9, when comparing the characteristics A' and B' in the light non-irradiating mode, in the case of the thin film transistor (shown by A') of the embodiment of the invention, the current (dark current) flowing across the source electrode and the drain electrode near the gate electrode voltage of 20 V is increased by tens of %. On the other hand, when comparing the characteristics A and B in the light irradiating mode, in both of the thin film transistor of the embodiment of the invention and the thin film transistor as a comparison example, similar currents (photo currents) flowing across the source electrode and the drain electrode are obtained.

From FIG. 9, it will be understood that the charge transfer ability of the thin film transistor of the embodiment of the invention is improved as compared with the charge transfer ability of the thin film transistor as a comparison example because of an increase in current between the source and drain electrodes in the light non-irradiating mode. It will be also understood that the current between the source and drain electrodes in the light irradiating mode in a region of V$_g$ ≦ 0 V where an enough large ratio between the photo current and the dark current can be obtained in the thin film transistor of the embodiment of the invention is almost similar to that of the thin film transistor as a comparison example, so that the transistor of the embodiment can also be used as a photoelectric converting section.

Embodiment 2

Figure 10:
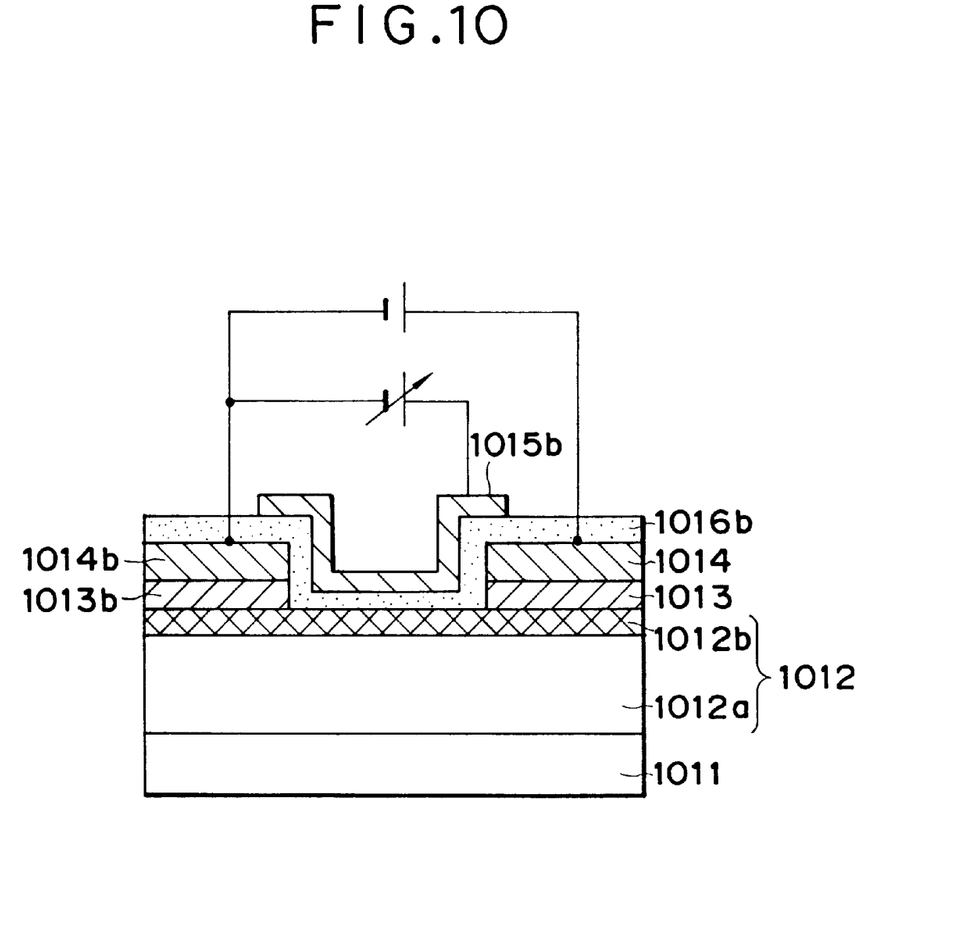

FIG. 10 is a schematic constructional diagram of a photoelectric converting device in which the charge transfer ability of the photoelectric converting device of the embodiment 1 is further improved. In the diagram, the same component elements as those in FIG. 6 are designated by the same reference numerals. In FIG. 10, reference numeral 1015$b$ denotes a gate electrode and 1016$b$ indicates a gate insulative layer made of SiN$_x$ or the like. The device of FIG. 10 differs from that of FIG. 6 with respect to the depositing depositions of an a-Si:H layer 1012$a$ and a crystallite layer 1012$b$ of the photoconductive semiconductor layer 1012 and the position of the gate electrode 1015$b$.

The photoelectric converting device of the embodiment 2 is manufactured in the following manner.

(1) The step (1) is similar to the step (3) in the embodiment 1 except that the forming order of the a-Si:H layer 1012*a* and the crystallite layer 1012*b* is reversed and the substrate temperature when the crystallite layer 1012*b* is formed is set to 230° C.

(2) The step (2) is similar to the step (4) in the embodiment 1.

(3) The step (3) is similar to the step (5) in the embodiment 1.

(4) The substrate 1011 is set into the ordinary plasma CVD apparatus and the substrate temperature is set to 220° C. After that, the SiH$_4$ gas, NH$_3$ gas, and H$_2$ gas are introduced at predetermined mixture ratios and an SiN$_x$:H layer is deposited, thereby forming the insulative layer 1016*b* having a film thickness of 3000 Å.

(5) Lastly, an ITO transparent layer having a film thickness of 2000 Å is formed by a sputtering method and is patterned, thereby forming the transparent gate electrode 1015*b*.

Figure 11:
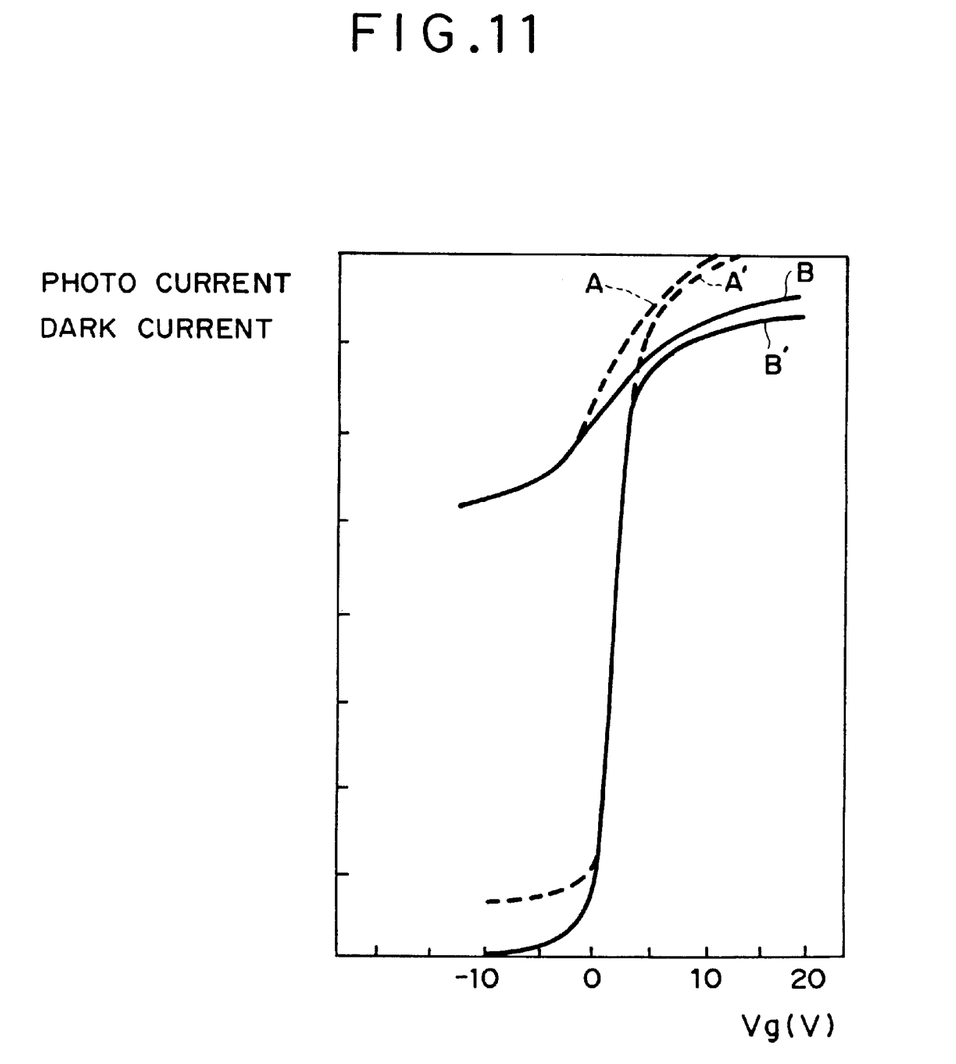

To examine the fundamental characteristics of the thin film transistor formed as mentioned above, a voltage within a range from −10 to 20 V is applied to the gate electrode 1015*b*, a voltage of 1 V is applied to the drain electrode 1014*a*, a voltage of 0 V is applied to the source electrode 1014*b*, and currents flowing between the drain electrode 1014*a* and the source electrode 1014*b* in the light irradiating mode and the light non-irradiating mode are measured. In FIG. 11, an axis of ordinate indicates a current between the drain electrode 1014*a* and the source electrode 1014*b* and an axis of abscissa shows a voltage V$_G$ of the gate electrode 1015*b*. In FIG. 11, A and A' indicate the characteristics of the thin film transistor of the embodiment of the invention in both of the light irradiating mode and the light non-irradiating mode, respectively. B and B' indicate the characteristics of the thin film transistor as a comparison example in the light irradiating mode and the light non-irradiating mode, respectively, in the case where such a thin film transistor is formed by substantially the same forming method as the above method except that the step (1) of forming the crystallite layer 1012*b* among the steps (1) to (5) of forming the thin film transistor of the embodiment of the invention and that the a-Si:H layer having a film thickness of 6000 Å is formed in the step of forming the a-Si:H layer 1012*a*. As shown in FIG. 11, when comparing the characteristics A' and B' in the light non-irradiating mode, in the case of the thin film transistor of the embodiment of the invention, the current (dark current) flowing across the source and drain electrodes near the gate electrode voltage of 20 V is increased by about 1.5 digits. When comparing the characteristics A and B in the light irradiating mode, in both of the thin film transistor of the embodiment of the invention and the thin film transistor as a comparison example, the similar currents (photo currents) flowing across the source and drain electrodes are obtained.

It will be understood from FIG. 11 that the charge transfer ability of the thin film transistor of the embodiment of the invention is fairly improved as compared with the charge transfer ability of the thin film transistor as a comparison example due to a large increase in current flowing between the source and drain electrodes in the light non-irradiating mode. Since the current between the source and drain electrodes in the light irradiating mode in the thin film transistor of the embodiment of the invention is almost similar to that in the thin film transistor as a comparison example, it will be understood that the thin film transistor of the embodiment can also be used as a photoelectric converting section.

Embodiment 3

Figure 12:
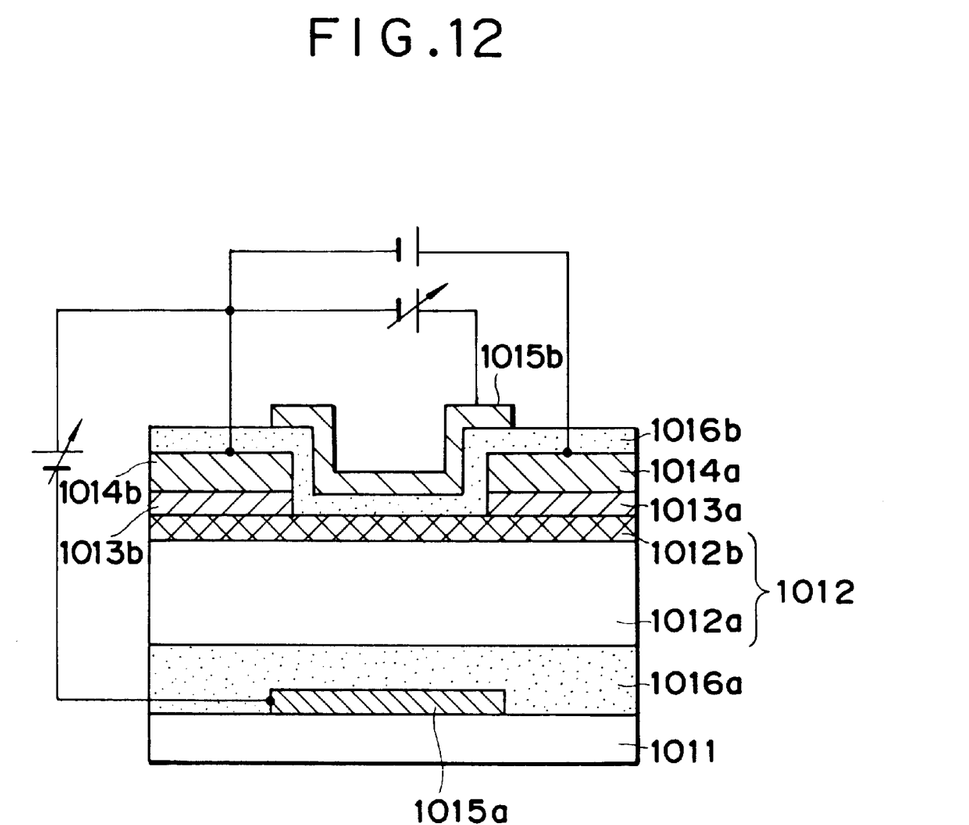

FIG. 12 is a schematic constructional diagram of a photoelectric converting device in which the charge transfer ability of the photoelectric converting device of the embodiment 1 is further improved. In FIG. 12, the component elements similar to those shown in FIG. 6 are designated by the same reference numerals. In FIG. 12, reference numeral 1015*a* denotes a third electrode (gate electrode); 1015*b* the fourth electrode (gate electrode); and 1016*a* and 1016*b* gate insulative layers made of SiN$_x$ or the like. The device of FIG. 12 largely differs from the device of FIG. 6 with respect to the depositing positions of the a-Si:H layer 1012*a* and the crystallite layer 1012*b* of the photoconductive semiconductor layer 1012 and the presence or absence of the gate electrode 1015*b*.

The photoelectric converting device of the embodiment is manufactured in the following manner.

(1) The step (1) is similar to the step (1) of the embodiment 1.

(2) The step (2) is similar to the step (2) of the embodiment 1.

(3) The step (3) is similar to the step (3) of the embodiment 1 except that the forming order of the a-Si:H layer 1012*a* and the crystallite layer 1012*b* is reversed and the substrate temperature when the crystallite layer 1012*b* is formed is set to 230° C.

(4) The step (4) is similar to the step (4) of the embodiment 1.

(5) The step (5) is similar to the step (5) of the embodiment 1.

(6) The substrate 1011 is set into the ordinary plasma CVD apparatus and the substrate temperature is set to 220° C. After that, the SiH$_4$ gas, NH$_3$ gas, and H$_2$ gas are introduced at predetermined mixture ratios and an SiN$_x$:H layer is deposited, thereby forming the insulative layer 1016*b* having a film thickness of 3000 Å.

(7) Lastly, an ITO transparent layer having a film thickness of 2000 Å is formed by a sputtering method and is patterned, thereby forming the transparent gate electrode 1015*b*.

Figure 13:
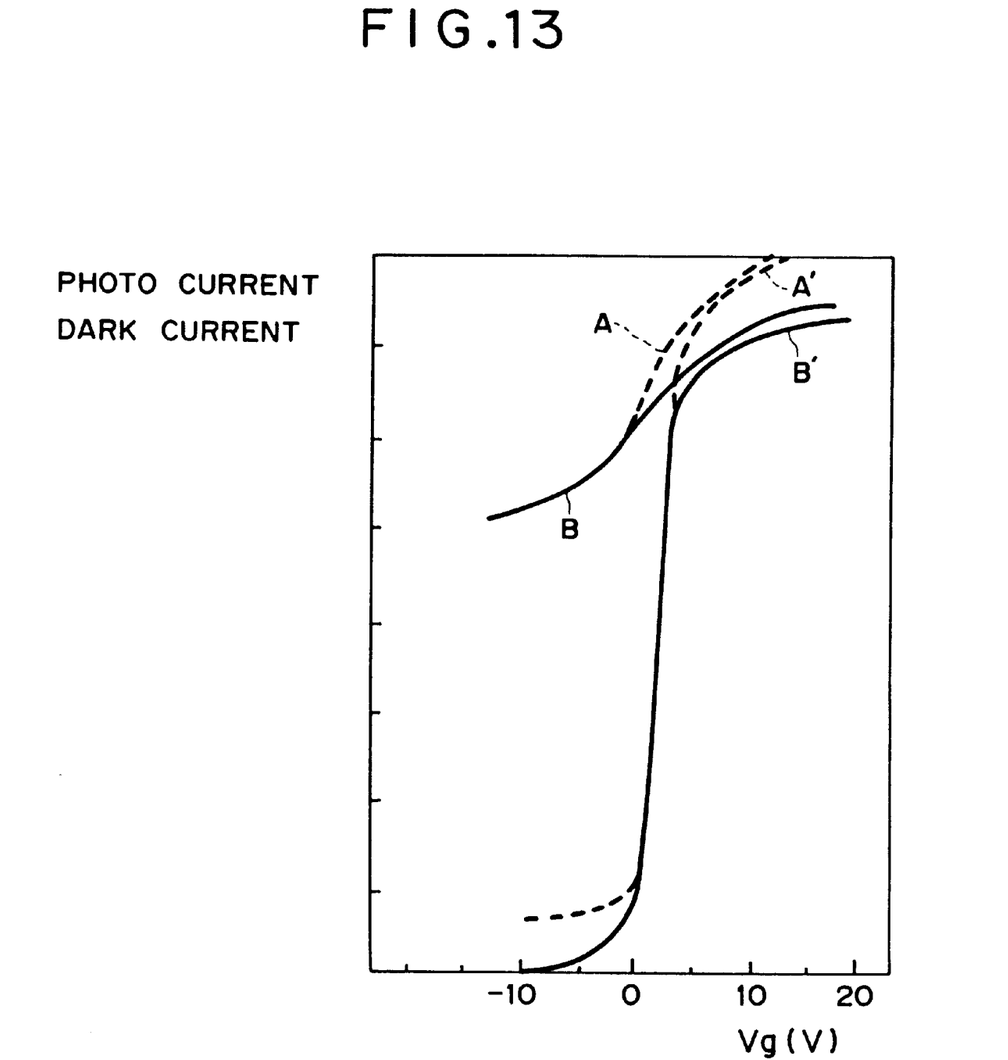

To examine the fundamental characteristics of the thin film transistor formed as mentioned above, a voltage within a range from −10 to 20 V is applied to the gate electrode 1015*b*, a voltage of 1 V is applied to the drain electrode 1014*a*, a voltage of 0 V is applied to the source electrode 1014*b*, and currents flowing between the drain electrode 1014*a* and the source electrode 1014*b* in both the light irradiating mode and the light non-irradiating mode are measured. The voltage of gate electrode 1015 is set to 0 V. The light enters from the direction on the side of the gate electrode 1015*b*. In FIG. 13, an axis of ordinate indicates the current flowing between the drain electrode 1014*a* and the source electrode 1014*b* and an axis of abscissa indicates the voltage V$_G$ of the gate electrode 1015*b*. In FIG. 13, A and A' indicate the characteristics of the thin film transistor of the embodiment of the invention in both of the light irradiating mode and the light non-irradiating mode, respectively. B and B' indicate the characteristics of the thin film transistor as a comparison example in the light irradiating mode and the light non-irradiating mode, respectively, in the case where such a thin film transistor is formed by substantially the same method as the foregoing method except that the step (3) of forming the crystallite layer 1012*b* among the steps (1) to (7) of forming the thin film transistor of the embodiment of the invention is omitted and that the a-Si:H layer having a film thickness of 6000 Å is formed in the step of forming the a-Si:H layer 1012*a*. As shown in FIG. 13, when comparing the characteristics A' and B' in the light non-irradiating mode, in the case of the thin film transistor of the embodiment of the invention, the current (dark current) flowing between the source and drain electrodes near the gate electrode voltage of 20 V is increased by about 1.5 digits. When comparing the characteristics A and B in the light irradiating mode, in both of the thin film transistor of the embodiment of the invention and the thin film transistor as a comparison example, the similar currents (photo currents) flowing between the source and drain electrodes are obtained.

It will be understood from FIG. 13 that the charge transfer ability of the thin film transistor of the embodiment of the invention is fairly improved as compared with the charge transfer ability of the thin film transistor as a comparison example due to a large increase in current across the source and drain electrodes in the light non-irradiating mode. Since the current flowing between the source and drain electrodes in the light irradiating mode in the thin film transistor of the embodiment of the invention is almost similar to that in the thin film transistor as a comparison example, it will be understood that the thin film transistor of the embodiment can also be sufficiently used as a photoelectric converting section.

Embodiment 4

A circuit as shown in FIG. 3 is constructed as a one-dimensional contact sensor array by using the photoelectric converting section comprising the thin film transistor formed in the second embodiment and the drive circuit section comprising such a thin film transistor or the like. In a manner similar to the embodiment 1, the various characteristics of the thin film transistor type photoelectric converting section are examined. Thus, the characteristics similar to those in the embodiment 1 were obtained. In the thin film transistor of the drive circuit section or the like, sufficient characteristics are shown and the charge transfer ability is improved by about one digit.

Figure 14:
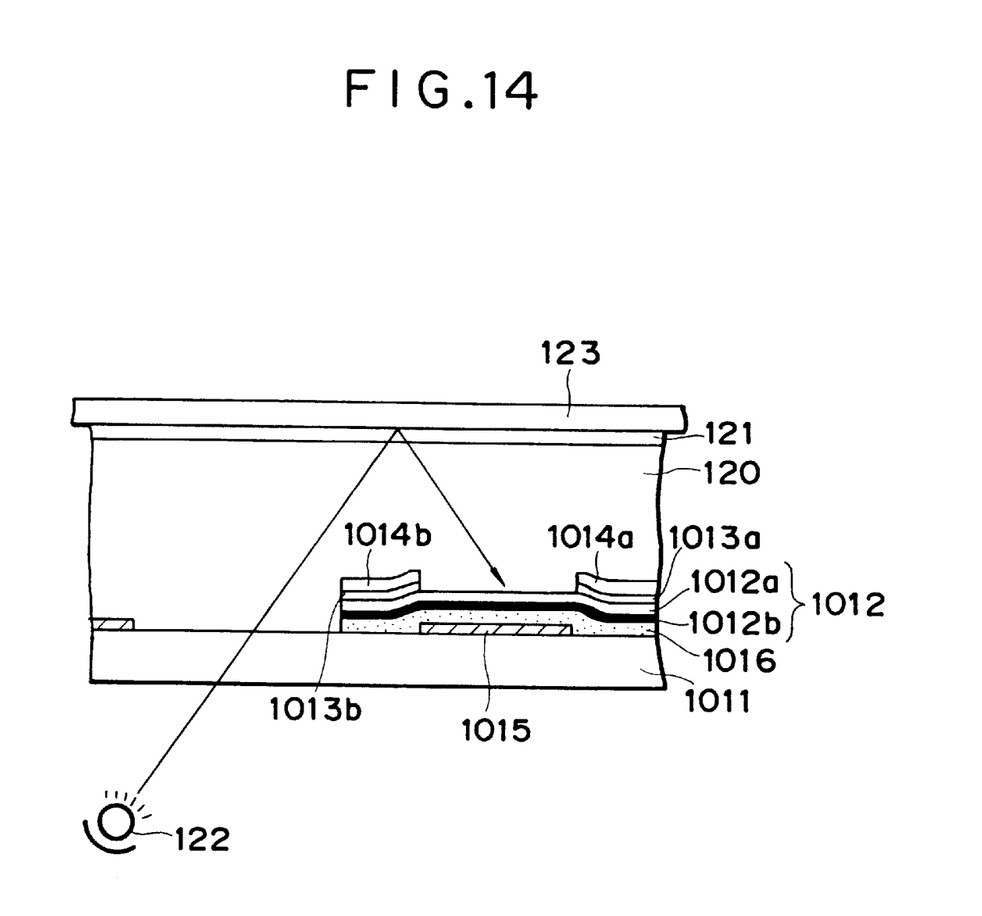
FIG. 14 is an installation diagram of a contact photo sensor array using the photoelectric converting device of the invention.

FIG. 14 is a cross-sectional view showing a state in which the photoelectric converting device of the invention is installed as a one-dimensional complete contact type photo sensor array. In FIG. 14, an abrasion resistant layer 121 made of glass or the like is formed through a protective layer 120 over the photoelectric converting section and the drive circuit section. An original 123 is illuminated by a light source 122 such as a light emitting diode or the like from the back side of the translucent substrate 1011 such as glass or the like, thereby reading the original 123. It will be obviously understood that the photo sensor array using the photoelectric converting device of the invention can be also used as a one-dimensional contact type photo sensor array using an equal magnification image forming lens.

In the above embodiments, $SiH_4$, $H_2$, and the like are used as materials to form the thin film. However, the invention is not limited to those materials but can also use materials containing F or the like or materials containing gases having a chemical formula of $SiH_{2n+2}$ (n is an integer of 2 or more). As silicon used in the invention, in addition to materials comprising at least silicon and hydrogen, silicon materials containing, for instance, fluorine or the like and other materials can be used.

According to the invention as described above, since the semiconductor layer or photoconductive semiconductor layer comprising the crystallite layer and the amorphous layer is used, it has a good performance as a semiconductor apparatus and a good performance is maintained as-a photoelectric converting section. Therefore, there is provided a photoelectric converting apparatus having a drive circuit section in which a thin film transistor or the like of the drive circuit section can be formed by a construction which is common to that of the photoelectric converting section, the costs are low, the size is not enlarged, and an enough high transfer ability is obtained.

What is claimed is:

1. A semiconductor apparatus comprising an arrangement of plural semiconductor devices in column, comprising:
   a substrate;
   an insulating layer provided on said substrate;
   a semiconductor layer having a laminating portion of i-type semiconductor and n-type semiconductor provided on said insulating layer, wherein said semiconductor layer comprises, in this order from a side of said insulating layer, (i) an i-type layer including crystals whose average grain size is within a range of 50–350 Å and including no impurity controlling the conductivity, (ii) an amorphous layer, including no impurity controlling the conductivity, said amorphous layer being arranged adjacent to said layer including the crystals, and (iii) n-type ohmic contact layers arranged in a spaced relation to each other on said amorphous layer; and
   an electrode provided on said ohmic contact layer.

2. A device according to claim 1, wherein the impurity of controlling the conductivity is a phosphorus.

3. A device according to claim 1, wherein said amorphous layer is an amorphous silicon layer.

4. A device according to claim 3, wherein said amorphous silicon layer includes at least one of hydrogen and fluorine.

5. A device according to claim 1, wherein said layer including the crystals comprises silicon.

6. A device according to claim 5, wherein said layer including the crystals further includes at least one of hydrogen and fluorine.

7. A semiconductor apparatus comprising an arrangement of plural semiconductor devices in column, comprising:
   a substrate;
   a semiconductor layer provided on said substrate, wherein said semiconductor comprises, in this order from a side of said substrate, (i) an i-type amorphous layer, (ii) an i-type crystalline layer including crystals whose average grain size is within a range 50–350 Å and whose thickness is not greater than that of said amorphous layer, and (iii) n-type ohmic contact layers arranged in a spaced relation to each other in contact with said crystalline layer;
   an electrode arranged adjacent to said ohmic contact layers; and
   a gate electrode arranged at a position corresponding to a space between the ohmic contact layers on said amorphous layer through an insulating layer.

8. A device according to claim 7, wherein said ohmic contact layer comprises silicon and phosphorus.

9. A device according to claim 7, wherein said semiconductor layer comprises at least one of silicon, hydrogen and fluorine.

10. A device according to claim 7, wherein said ohmic contact layer is $n^+$ type one.

11. A device according to claim 1, wherein said layer including the crystals has a thickness within a range 500–2000 Å.

12. A device according to claim 7, wherein said crystalline layer has a thickness within a range 500–2000 Å.

13. A semiconductor apparatus comprising an arrangement of plural semiconductor devices, each of which comprises:

a substrate;

an electrode provided on said substrate;

a semiconductor layer provided on said electrode, wherein said semiconductor layer comprises, in this order from a side of said substrate, (i) an i-type amorphous matrix layer comprising silicon atoms, (ii) an i-type crystalline matrix layer comprising silicon atoms, including crystals whose average grain size is within a range of 50–350 Å, and being arranged in contact with said amorphous matrix layer, and (iii) an n-type semiconductor matrix layer comprising silicon atoms, further comprising phosphorus atoms, and being arranged in contact with said crystalline matrix layer; and an electrode arranged in contact with said n-type semiconductor matrix layer.

14. A semiconductor apparatus according to claim 13, wherein said i-type crystalline layer has a thickness not greater than the thickness of said i-type amorphous layer.

* * * * *

UNITED STATES PATENT AND TRADEMARK OFFICE
CERTIFICATE OF CORRECTION

PATENT NO. : 6,140,666
DATED : October 31, 2000
INVENTOR(S) : Masato Yamanobe

It is certified that error appears in the above-identified patent and that said Letters Patent is hereby corrected as shown below:

<u>Title page,</u>
Item [54], in the title "LARGE" should read -- LAYER --; and "50-350-Å" should read -- 50-350Å --.

<u>Column 1,</u>
Line 2, "LARGE" should read -- LAYER --;
Line 4, "50-350-Å" should read -- 50-350Å --; and
Line 41, "photo current" should read -- photo-current --.

<u>Column 2,</u>
Line 9, "in." should read -- in --; and
Line 59, "cross sectional" should read -- cross-sectional --.

<u>Column 8,</u>
Line 56, "both of" should read -- both --.

<u>Column 9,</u>
Line 67, "as-a" should read -- as a --.

Signed and Sealed this

Second Day of July, 2002

Attest:

*Attesting Officer*

JAMES E. ROGAN
*Director of the United States Patent and Trademark Office*